United States Patent [19]

Liu et al.

[11] Patent Number: 5,767,737
[45] Date of Patent: Jun. 16, 1998

[54] METHODS AND APPARATUS FOR CHARGING A SENSE AMPLIFIER

[75] Inventors: Lawrence Liu, San Jose, Calif.; Michael Murray, Bellevue, Wash.; Li-Chun Li, Los Gatos, Calif.

[73] Assignee: Mosel Vitelic, San Jose, Calif.

[21] Appl. No.: 695,058

[22] Filed: Aug. 9, 1996

[51] Int. Cl.[6] .................................. G05F 1/10; G11C 7/06
[52] U.S. Cl. .................................. 327/544; 327/51
[58] Field of Search .................................. 327/51–57, 407, 327/408, 530, 544, 545; 365/205, 226

[56] References Cited

U.S. PATENT DOCUMENTS

| | | | |
|---|---|---|---|
| 5,295,111 | 3/1994 | Tsujimoto | 365/226 |
| 5,313,434 | 5/1994 | Abe | 365/203 |
| 5,325,335 | 6/1994 | Ang et al. | 365/205 |
| 5,367,488 | 11/1994 | An | 365/203 |
| 5,446,694 | 8/1995 | Tanaka et al. | 365/205 |
| 5,477,498 | 12/1995 | Ooishi | 365/203 |
| 5,539,279 | 7/1996 | Takeuchi et al. | 365/203 |
| 5,646,880 | 7/1997 | Yuh | 365/205 |
| 5,657,278 | 8/1997 | Lee | 365/205 |

*Primary Examiner*—Toan Tran
*Attorney, Agent, or Firm*—Skjerven, Morrill, MacPherson, Franklin & Friel; Michael Shenker

[57] ABSTRACT

A dynamic random access memory generates an internal power supply voltage IVCC. IVCC is lower in magnitude than the external power supply voltage EVCC. During a read operation, the sense amplifiers are powered from EVCC while the bit lines charge to their output levels. Then the sense amplifiers stop being powered from EVCC and begin being powered from IVCC to maintain the bit lines at their output levels. A timer defines the time that the sense amplifiers are powered from EVCC. This time depends inversely on EVCC. The timer includes a transistor connected between EVCC and an input of the inverter. The time that the sense amplifiers are powered from EVCC is defined by the time that the input of the inverter charges to the trip point of the inverter.

17 Claims, 4 Drawing Sheets

METHODS AND APPARATUS FOR CHARGING A SENSE AMPLIFIER

BACKGROUND OF THE INVENTION

The present invention relates to electrical circuits, and more particularly to charging a sense amplifier.

Reducing power consumption and increasing sense amplifier speed are important goals in design of many circuits, such as memories, that use sense amplifiers. However, these goals are conflicting since reducing power consumption can reduce speed. There is a need to reduce power consumption in circuits using sense amplifiers without reducing the circuit speed.

SUMMARY

The present invention provides methods and apparatus for charging a sense amplifier. In some embodiments, the invention reduces power consumption without reducing the circuit speed. During signal amplification, the sense amplifier is powered from a high voltage power supply to obtain a high speed. Then the sense amplifier is switched to a low voltage power supply to reduce power consumption.

In some embodiments, the sense amplifier is part of a memory, for example, a dynamic random access memory (DRAM). The memory is powered by an external power supply supplying a voltage EVCC (external VCC). The memory includes an internal power supply supplying a voltage IVCC (Internal VCC). The internal voltage IVCC is lower in magnitude than the external voltage EVCC. IVCC serves to reduce power consumption and also to reduce the stress on the memory devices (such as transistors). The internal power supply IVCC is particularly suitable for high density memories including 16 megabit and higher density integrated memories.

In a read operation in some DRAM embodiments, the sense amplifiers drive one bit line in each DRAM column to a high voltage of IVCC, and the other bit line in the column to a low voltage (VSS). Driving a bit line to internal voltage IVCC rather than external voltage EVCC reduces power consumption significantly because the bit lines have significant capacitance. While the bit lines are charging to their respective voltages IVCC or VSS, the sense amplifiers are connected to external voltage EVCC. Connection to EVCC rather than IVCC allows the bit lines to charge fast. When the bit lines have reached their respective IVCC/VSS voltages, the sense amplifiers keep the bit lines at these voltages as long as needed to complete the read operation and to restore the charge in memory cells connected to the bit lines. At this time, in order to reduce power consumption, the sense amplifiers are switched to the internal power supply IVCC. Switching to IVCC reduces power consumption without reducing the speed.

Some circuits including memories can be operated in a range of values of the external voltage EVCC. The internal voltage IVCC is kept constant over the range of EVCC values. Since IVCC is constant, the bit lines charge to IVCC faster when EVCC is higher. To reduce power consumption for high EVCC values, the time that the sense amplifiers are connected to EVCC is made to depend inversely on EVCC. In some embodiments, a simple timer is provided to define the time that the sense amplifiers are connected to EVCC. The timer includes a transistor connected between EVCC and an input of an inverter. The output of the inverter is connected to the output of the timer. The time that the sense amplifiers are connected to EVCC is the time that the input of the inverter charges through the transistor to the trip point of the inverter. This time varies inversely with EVCC. The RC parameter of the input of the inverter is adjusted experimentally so that the time period defined by the timer is adequate for different EVCC values.

Other features and advantages of the invention are as described below. The invention is defined by the appended claims.

DESCRIPTION OF PREFERRED EMBODIMENTS

Figure 1:
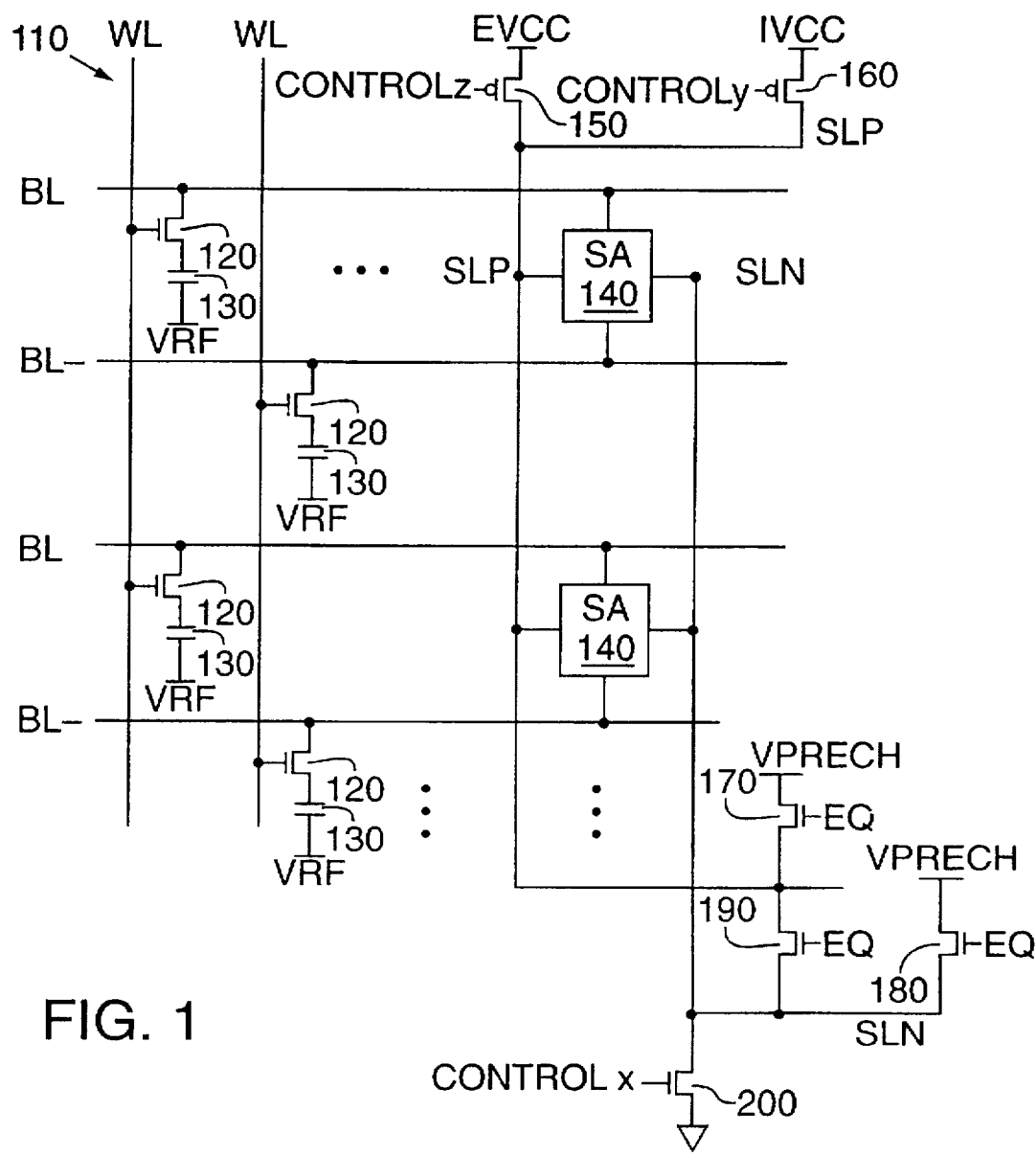
FIG. 1 is a diagram of a DRAM according to the present invention.

FIG. 1 diagrams a DRAM 110. In each DRAM cell, NMOS transistor 120 has a source connected to one plate of capacitor 130. The other plate of capacitor 130 is connected to a voltage plate having a constant voltage VRF. In some embodiments, VRF is about one half of an internal power supply voltage IVCC described below. In other embodiments, VRF is ground.

The DRAM cells are arranged in an array. Each column of the array includes a bit line BL and a complementary bit line BL-. Word lines WL extend along the array rows. In each column, the gate of each transistor 120 is connected to a separate word line WL. The drain of every other transistor 120 is connected to the bit line BL. The drains of the remaining transistors 120 are connected to the bit line BL-.

Figure 5:
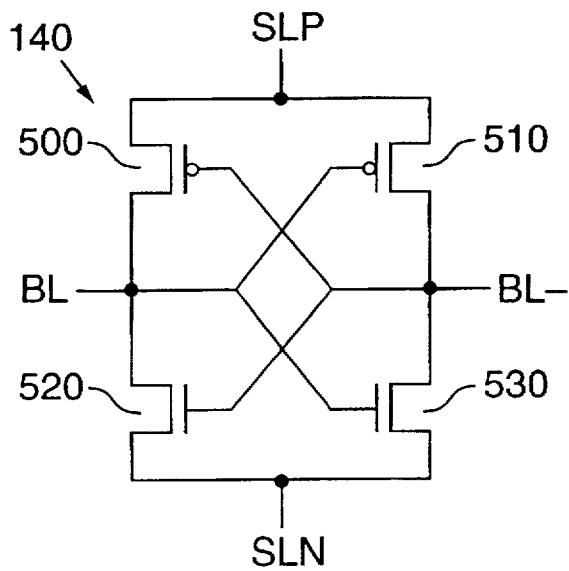
FIG. 5 is a diagram of a prior art sense amplifier used in the DRAM of FIG. 1.

In each column, bit lines BL and BL- are connected to input/output nodes of a respective sense amplifier 140 (FIG. 5). One power supply input of each sense amplifier 140 is connected to a node SLP common to all the sense amplifiers. Another power supply input is connected to a node SLN also common to all the sense amplifiers. During amplification, node SLP provides a high voltage to amplifiers 140. Node SLN provides a low voltage.

Node SLP is connected to an external power supply voltage EVCC through PMOS transistor 150. The gate of transistor 150 receives a signal CONTROLz. Node SLP is connected to the internal power supply voltage IVCC through PMOS transistor 160. The gate of transistor 160 receives a signal CONTROLy. IVCC is lower in magnitude than EVCC. IVCC is used instead of EVCC to reduce power consumption and the stress on the DRAM devices. IVCC is generated from EVCC by a voltage regulator using methods known in the art.

Node SLN is connected to a voltage VSS (typically ground) through NMOS transistor 200 whose gate receives a signal CONTROLx.

During amplification, each sense amplifier 140 drives one of the respective bit lines BL, BL- to IVCC and the other one of the bit lines to VSS.

Figure 2:
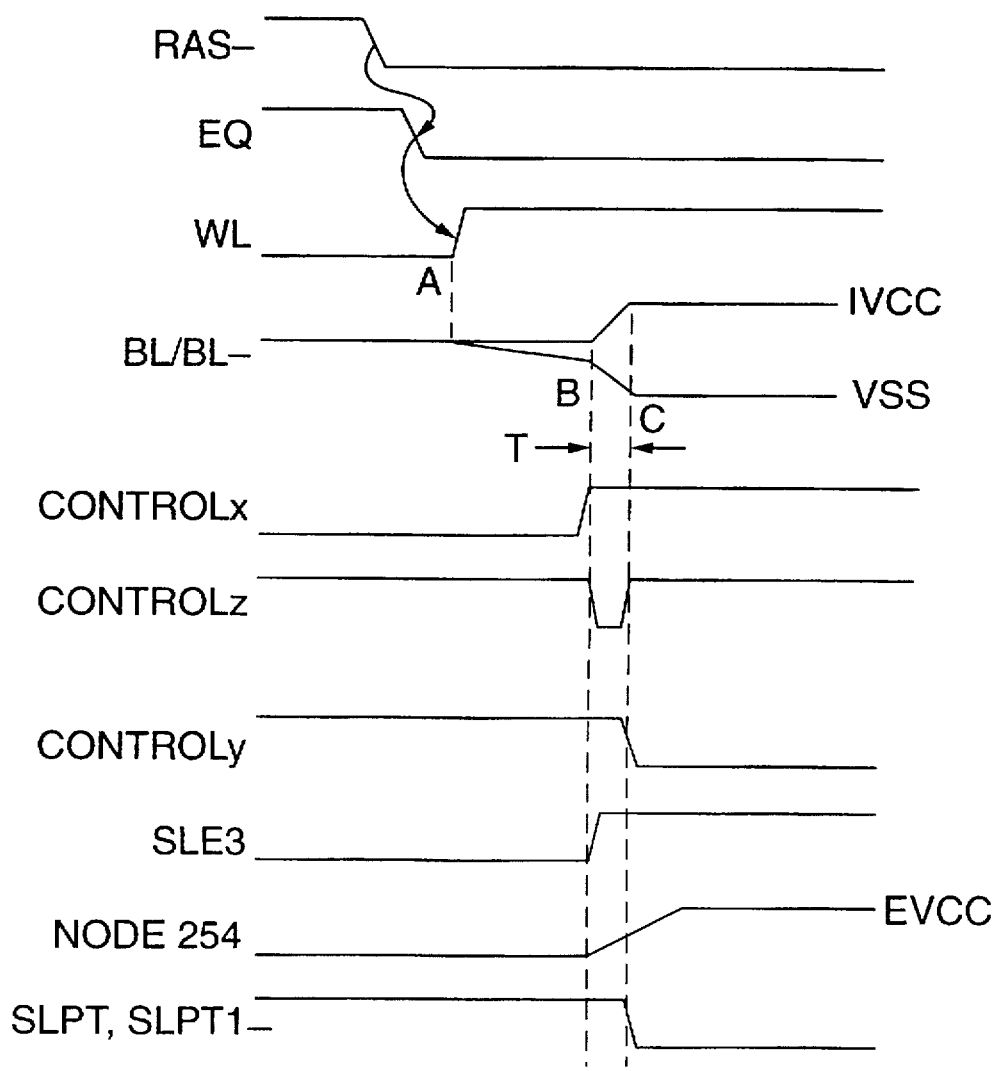
FIG. 2 is a timing diagram for the DRAM of FIG. 1.

FIG. 2 illustrates the timing for a read operation in memory 110. Before the read operation starts, the bit lines BL, BL- are precharged to a voltage VPRECH. Voltage VPRECH is between VSS (ground) and internal voltage IVCC. VPRECH is generated from IVCC.

Precharge voltage VPRECH is connected to node SLP through NMOS transistor 170 (FIG. 1) and to node SLN through NMOS transistor 180. Node SLP is connected to node SLN through NMOS transistor 190. The gates of transistors 170, 180, 190 receive equalization signal EQ. Before the read operation starts, equalization signal EQ is high. Consequently, nodes SLP and SLN are precharged to VPRECH. Signals CONTROLy, CONTROLz are high (CONTROLz=EVCC, CONTROLy=IVCC). Therefore, transistors 150, 160 are off. CONTROLx is low (at VSS). Therefore, transistor 200 is off.

At the start of the read operation, row address strobe signal RAS- (FIG. 2) becomes low ("-" after a signal name indicates the inverse of the signal). In response to RAS-, signal EQ becomes low turning off the precharge transistors 170, 180, 190. The transistors (not shown) that precharge the bit lines BL, BL- are also turned off. Then at a time A, a selected word line WL becomes high. Transistors 120 in the corresponding row turn on. The charge on the corresponding capacitors 130 becomes shared with the respective bit lines BL or BL-. In each column, bit lines BL, BL- separate.

Then at a time B, amplification begins. Signal CONTROLx becomes high turning on transistor 200. Signal CONTROLz becomes low turning on transistor 150. Consequently, node SLP becomes connected to external voltage supply EVCC. EVCC provides fast amplification. Therefore, bit lines BL, BL- quickly reach their respective voltages IVCC, VSS. The bit lines reach these voltages at a time C.

At time C, signal CONTROLz becomes high, and CONTROLy becomes low. Transistor 150 turns off, and transistor 160 turns on connecting nodes SLP to IVCC. The internal power supply IVCC maintains the bit lines at constant voltages as long as needed for the read operation. Switching from EVCC (from transistor 150) to IVCC (to transistor 160) reduces power consumption and stress on the memory devices without reducing the read operation speed.

In some embodiments, external power supply voltage EVCC may be any voltage within some range, for example, between 4V to 6V. Over this range, the internal voltage IVCC is a constant value, for example, a value between 3V and 3.5V. Since the bit lines charge faster for higher EVCC values, the time period T between time points B and C, when CONTROLz is low, is made to depend inversely on the voltage EVCC. If the time period T would not vary but were fixed to accommodate the low EVCC value, power would be wasted.

Figure 3:
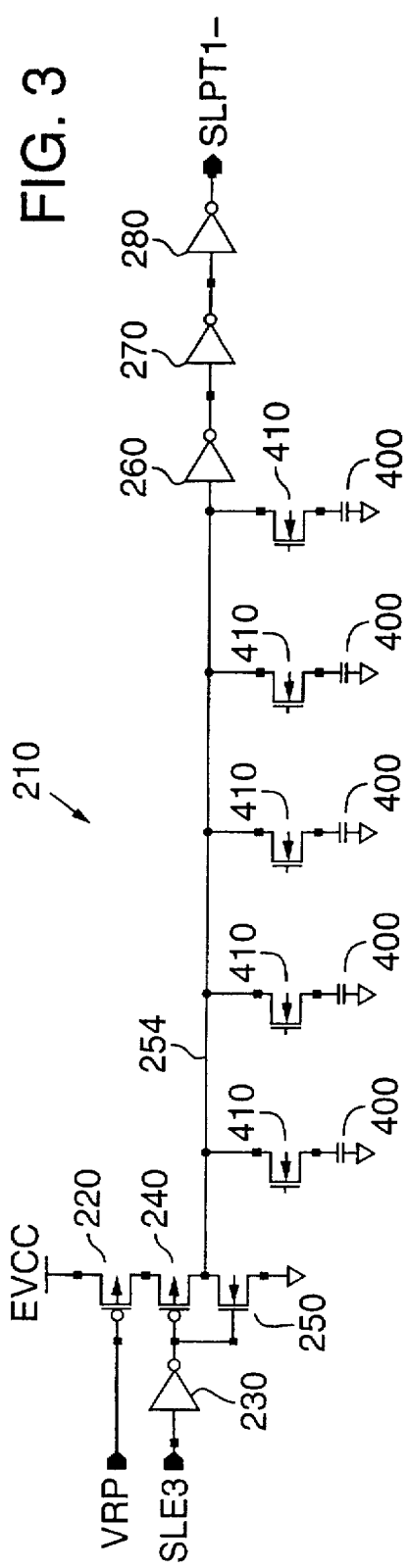
FIG. 3 is a circuit diagram of a timer used in the DRAM of FIG. 1.
Figure 4:
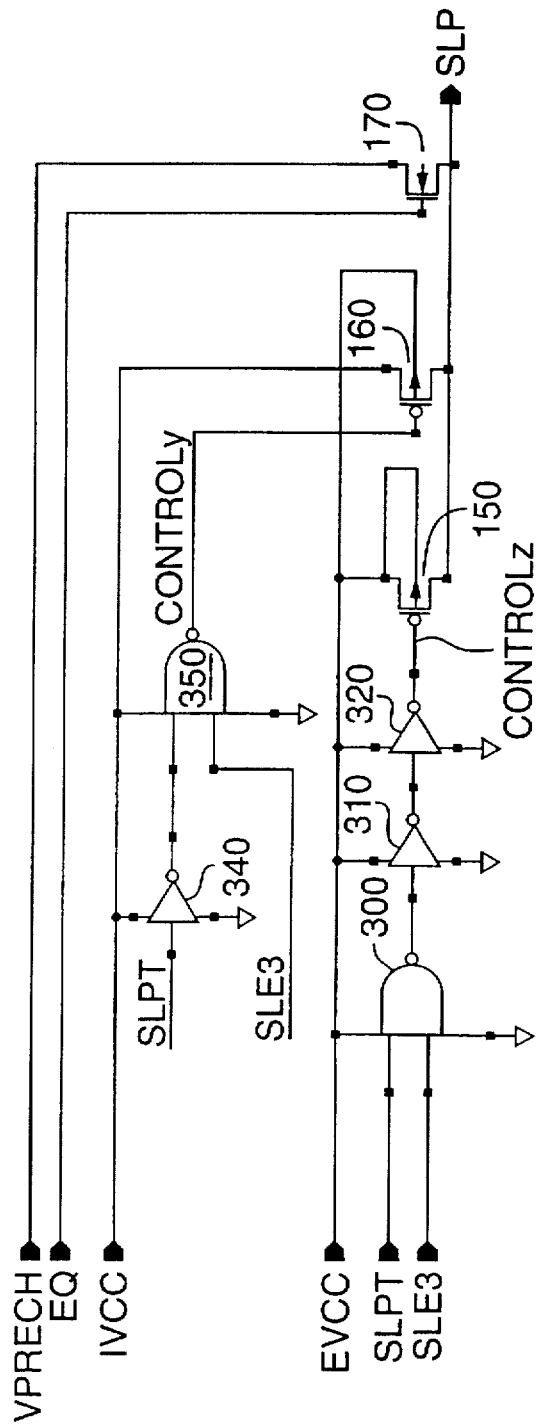
FIG. 4 is a circuit diagram of a circuit generating control signals for the DRAM of FIG. 1.

FIG. 3 illustrates a timer 210 used to vary the period T inversely with EVCC. The timer output SLPT1- is used to generate the signals CONTROLy and CONTROLz as shown in FIG. 4. Signal SLPT in FIG. 4 has the same value as the timer output SLPT1-.

In timer 210, a constant reference voltage VRP is delivered to the gate of PMOS transistor 220. In some embodiments, VRP=2V when the external power supply voltage EVCC varies between 4 and 7V. The sense enable signal SLE3 is connected to the input of inverter 230. The output of inverter 230 is connected to the gates of PMOS transistor 240 and NMOS transistor 250. The source of transistor 240 is connected to the external power supply voltage EVCC through transistor 220. Node 254 at the drain of transistor 240 is connected to the drain of transistor 250 whose source is connected to VSS. Node 254 is also connected to the output node SLPT1- through serially connected inverters 260, 270, 280.

Signal SLPT (FIG. 4) and enable signal SLE3 are delivered to respective inputs of NAND gate 300. The output of gate 300 is connected to the input of inverter 310. The output of inverter 310 is connected to the input of inverter 320. The output of inverter 320 provides the control signal CONTROLz. Gate 300 and inverters 230, 260, 270, 280, 310, 320 are CMOS circuits powered by external voltage supply EVCC and by VSS.

Signal SLPT is also connected to the input of inverter 340. The output of inverter 340 and the sense enable signal SLE3 are connected to respective inputs of NAND gate 350. The output of NAND gate 350 provides control signal CONTROLy. Inverter 340 and gate 350 are CMOS circuits powered by the internal voltage supply IVCC and by VSS.

Before the row address strobe RAS- is asserted, sense enable signal SLE3 is low. See FIG. 2. Transistor 240 is therefore off, and transistor 250 is on. Node 254 is low, and SLPT1- is high (at EVCC). The low level of sense enable signal SLE3 keeps the control signals CONTROLy and CONTROLz high (respectively at IVCC and EVCC).

At time B (FIG. 2), sense enable signal SLE3 rises to EVCC. Transistor 240 turns on, and transistor 250 turns off. Node 254 starts charging. However, the timer output SLPT1- remains high until the voltage on node 254 reaches the trip point of inverter 260. The high levels of sense enable signal SLE3 and timer output SLPT1- cause the control signal CONTROLz to become low. CONTROLy remains high.

At time C, the voltage on node 254 reaches the trip point of inverter 260. Consequently, the timer output SLPT1- becomes low. Therefore, CONTROLy becomes low and CONTROLz becomes high.

The time interval T depends inversely on external voltage EVCC. Indeed, if EVCC is higher, node 254 charges faster. The trip voltage of inverter 260 also rises slightly, but the rise in the trip voltage is offset by the high speed of charging the node 254. Therefore, the time T decreases.

The Appendix at the end of this description shows dimensions of some transistors in some embodiments of FIGS. 3 and 4. For a transistor, a single-number dimension indicates the channel length in micrometers. For example, the channel length of transistor 240 is 10 µm. A pair of numbers separated by a slash (e.g., 5/2) indicates the channel width/length in micrometers. For logic gates and inverters, "P=x" indicates the dimension "x" of the PMOS transistors; "N=y" indicates the dimension "y" of the NMOS transistors. "x" and "y" can be single numbers or pairs of numbers separated by a slash, as described above. All the dimensions are in micrometers.

Capacitors 400 (FIG. 3) serve to adjust the capacitance of node 254 to obtain a desired value of the charging time T. One plate of each capacitor 400 is connected to node 254 through respective NMOS transistor 410. The other plate is connected to VSS. The gate of each transistor 410 is connected to a respective programmable device (not shown) having a fuse. Each programmable device can be programmed to keep the gate of respective transistor 410 either high (at EVCC) or low (at VSS). In some embodiments, each capacitor 400 is a rectangular capacitor having the width/length dimensions shown in micrometers in the Appendix; the time T is 40 ns for EVCC=4V and 20 ns for EVCC=6V.

In some embodiments, capacitors 400 and transistors 410 are omitted. In other embodiments, one or more capacitors 400 are present, but transistors 410 are omitted. Some embodiments do not use programmable devices to control transistors 410. The number of transistors 410 and capacitors 400 varies from embodiment to embodiment.

FIG. 5 is a circuit diagram of one embodiment of sense amplifier 140. Such sense amplifiers are known in the art. Node SLP is connected to the sources of PMOS transistors 500, 510. The drains of transistors 500, 510 are connected to respective bit lines BL, BL- and to the drains of respective NMOS transistors 520, 530. The sources of transistors 520, 530 are connected to node SLN. The gates of transistors 500, 520 are connected to bit line BL-. The gates of transistors 510, 530 are connected to bit line BL.

Figure 6:
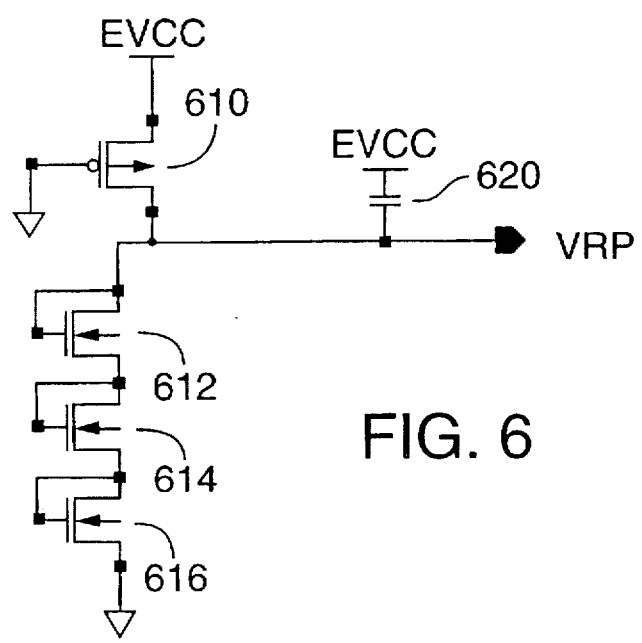
FIG. 6 is a diagram of a circuit generating a reference voltage for the timer of FIG. 3.

FIG. 6 is a diagram of a circuit generating the reference signal VRP. Signal VRP is provided on node VRP at the drain of PMOS transistor 610. The source of transistor 610 is connected to external power supply voltage EVCC. The gate is connected to VSS. Node VRP is connected to the drain and the gate of NMOS transistor 612. The source of transistor 612 is connected to the drain and the gate of NMOS transistor 614. The source of transistor 614 is connected to the drain and the gate of NMOS transistor 616. The source of transistor 616 is connected to VSS. Node VRP is connected to EVCC through capacitor 620. The dimensions of the devices in some embodiment of FIG. 6 are shown in the Appendix.

In some embodiments, transistor 610 is replaced by 1 megaohm resistor, and the size of each transistor 612, 614, 616 is 50/1. Capacitor 620 is omitted in some embodiments.

The embodiments described above illustrate but do not limit the invention. In particular, the invention is not limited by any particular voltage levels or circuitry. In some embodiments, EVCC is 3V, or is a negative voltage. Further, some embodiments of timer 210 are used in memories other than DRAMS, for example, in SRAMs. Non-CMOS inverters and logic gates are used in some embodiments. Other embodiments and variations are within the scope of the invention, as defined by the appended claims.

APPENDIX

| DEVICE | DIMENSIONS |
| --- | --- |
| Transistor 220 | 5/2 |
| Inverter 230 | P = 10, N = 5 |
| Transistor 240 | 10 |
| Transistor 250 | 20 |
| Inverter 260 | P = 4/2, N = 4/4 |
| Inverter 270 | P = 8, N = 4 |
| Inverter 280 | P = 24, N = 12 |
| Inverter 340 | P = 8, N = 4 |
| Gate 350 | P = 16, N = 16 |
| Gate 300 | P = 20/1.2, N = 20/1.2 |
| Inverter 310 | P = 120/1.2, N = 60/1.2 |
| Inverter 320 | P = 480/1.2, N = 240/1.2 |
| Transistor 150 | 2000/1.2 |
| Transistor 160 | 200/1 |
| Transistor 170 | 150/.8 |
| Each transistor 410 | 5/1.2 |
| Capacitors 400 | 20/20, 20/10, 10/10, 5/10, 5/5 |
| Transistor 610 | 3/200 |
| Each of transistors 612, 614, 616 | 100/1 |
| Capacitor 620 | 75/75 |

We claim:

1. A circuit comprising:

a sense amplifier having a node for receiving power; and a first circuit for supplying power to the node, wherein during amplification the first circuit is to supply power first from a first voltage, and then from a second voltage which is lower in magnitude than the first voltage, wherein a time that the first circuit is to supply power to the node from the first voltage depends inversely on the magnitude of the first voltage.

2. The circuit of claim 1 wherein:

the sense amplifier comprises an output node; and the first circuit is to supply power to the node from the first voltage until an output signal on the output node reaches an output level, and the first circuit is to supply power to the node from the second voltage but not from the first voltage to keep the output signal at the output level.

3. The circuit of claim 1 further comprising a timer for defining the time that the first circuit is to supply power to the node from the first voltage, the timer comprising:

a first transistor for connecting a node of the timer to a voltage; and an inverter connected between the node of the timer and an output of the timer.

4. The circuit of claim 3 wherein the timer further comprises a second transistor for connecting the node of the timer to a reference voltage to precharge the node of the timer to the reference voltage; and wherein the first transistor is to turn on and the second transistor is to turn off when the first circuit is to start supplying power from the first voltage, and wherein the first circuit is to stop supplying power from the first voltage and to start supplying power from the second voltage when the node of the timer reaches a trip point of the inverter.

5. The circuit of claim 3 wherein the first transistor is for connecting the node of the timer to the first voltage.

6. The circuit of claim 3 wherein the first transistor is a field effect transistor, and the circuit further comprises a circuit for generating a constant voltage on a gate of the first transistor.

7. The circuit of claim 1 further comprising:

one or more memory cells; and a bit line connected to the memory cells and to the sense amplifier, the sense amplifier being for amplifying a signal on the bit line, wherein the first circuit is to supply power from the first voltage until a voltage on the bit line reaches an output level, and the first circuit is to supply power from the second voltage but not from the first voltage to maintain the bit line at the output level.

8. A method for supplying power to a sense amplifier, the method comprising:

supplying power to the sense amplifier from a first voltage to charge an output node of the sense amplifier to an output level; and then supplying power to the sense amplifier from a second voltage but not from the first voltage to maintain the output node at the output level, wherein the second voltage is lower in magnitude than the first voltage, wherein the power is supplied from the first voltage for a time which depends inversely on the magnitude of the first voltage.

9. A method for supplying power to a sense amplifier, the method comprising:

supplying power to the sense amplifier from a first voltage to charge an output node of the sense amplifier to an output level; and then supplying power to the sense amplifier from a second voltage but not from the first voltage to maintain the output node at the output level wherein the second voltage is lower in magnitude than the first voltage, wherein the method further comprises:

at a beginning of the step of supplying power from the first voltage, connecting an input of an inverter to the first voltage;

when a charge on the input of the inverter becomes sufficient to trip the inverter, then terminating the step of supplying power from the first voltage and starting the step of supplying power from the second voltage.

10. The method of claim 8 wherein the sense amplifier output node is connected to a bit line connected to a dynamic random access memory cell, the method further comprising, during the steps of supplying power from the first voltage and supplying power from the second voltage, amplifying by the sense amplifier a voltage on the bit line.

11. The circuit of claim 4 wherein the reference voltage is ground.

12. The method of claim 9 further comprising, before connecting the input of the inverter to the first voltage, providing a reference voltage on the input of the inverter.

13. The method of claim 12 wherein the reference voltage is ground.

14. The method of claim 9 wherein the sense amplifier output node is connected to a bit line connected to a dynamic random access memory cell, the method further comprising, during the steps of supplying power from the first voltage and supplying power from the second voltage, amplifying by the sense amplifier a voltage on the bit line.

15. A circuit comprising:

a sense amplifier having an output node; and first means for (1) supplying power to the sense amplifier from a first voltage to charge the output node to an output level, and then (2) supplying power to the sense amplifier from a second voltage but not from the first voltage to maintain the output node at the output level, wherein the second voltage is lower in magnitude than the first voltage;

wherein the first means comprises:

an inverter; and second means for connecting an input of the inverter to the first voltage at a beginning of supplying power from the first voltage, wherein when a charge on the input of the inverter becomes sufficient to trip the inverter, the first means terminates supplying power from the first voltage and starts supplying power from the second voltage.

16. The circuit of claim 15 further comprising means for providing a reference voltage on the input of the inverter before connecting the input of the inverter to the first voltage.

17. The circuit of claim 16 wherein the reference voltage is ground.

* * * * *